(12) United States Patent
Cheng et al.

(10) Patent No.: US 7,615,816 B2
(45) Date of Patent: Nov. 10, 2009

(54) BURIED PLATE STRUCTURE FOR VERTICAL DRAM DEVICES

(75) Inventors: Kangguo Cheng, Beacon, NY (US); Ramachandra Divakaruni, Ossining, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 11/692,473

(22) Filed: Mar. 28, 2007

(65) Prior Publication Data

US 2007/0158728 A1  Jul. 12, 2007

Related U.S. Application Data

(62) Division of application No. 11/085,663, filed on Mar. 21, 2005, now Pat. No. 7,247,536, which is a division of application No. 10/604,565, filed on Jul. 30, 2003, now Pat. No. 6,913,968.

(51) Int. Cl.
*H01L 27/108* (2006.01)
(52) U.S. Cl. .................. 257/301; 257/532; 257/534; 257/E27.092
(58) Field of Classification Search .......... 257/301, 257/532, 534, E27.092
See application file for complete search history.

(56) References Cited

U.S. PATENT DOCUMENTS

| | | | |
|---|---|---|---|
| 5,395,786 A | 3/1995 | Hsu et al. | |
| 5,804,851 A | 9/1998 | Noguchi et al. | |
| 6,004,844 A | 12/1999 | Alsmeier et al. | |
| 6,100,132 A | 8/2000 | Sato et al. | |
| 6,218,319 B1 | 4/2001 | Dutron et al. | |
| 6,281,068 B1 | 8/2001 | Coronel et al. | |
| 6,391,706 B2 | 5/2002 | Wu et al. | |
| 6,414,347 B1 | 7/2002 | Divakaruni et al. | |
| 6,426,251 B2 | 7/2002 | Bronner et al. | |
| 6,426,254 B2 | 7/2002 | Kudelka et al. | |
| 6,437,381 B1 | 8/2002 | Gruening et al. | |
| 6,440,793 B1 | 8/2002 | Divakaruni et al. | |
| 6,605,860 B1 * | 8/2003 | Tews et al. ............ 257/618 |
| 6,699,794 B1 | 3/2004 | Flietner et al. | |
| 6,740,555 B1 | 5/2004 | Tews et al. | |
| 7,087,948 B2 * | 8/2006 | Hsu et al. ............ 257/301 |
| 2001/0034112 A1 | 10/2001 | Brencher et al. | |
| 2002/0105019 A1 | 8/2002 | Mandelman et al. | |
| 2004/0079979 A1 | 4/2004 | Lee et al. | |
| 2004/0129965 A1 * | 7/2004 | Chen ............ 257/301 |

FOREIGN PATENT DOCUMENTS

JP  02260655  10/1990

(Continued)

OTHER PUBLICATIONS

S. Wolf et al.; Silicon Processing for the VLSI Era, vol. 1; Lattice Press, California, pp. 307-308, 323-324.

*Primary Examiner*—Victor A Mandala
(74) *Attorney, Agent, or Firm*—Cantor Colburn LLP; Joseph Petrokaitis

(57) ABSTRACT

A buried plate region for a semiconductor memory storage capacitor is self aligned with respect to an upper portion of a deep trench containing the memory storage capacitor.

3 Claims, 7 Drawing Sheets

FOREIGN PATENT DOCUMENTS

| | | |
|---|---|---|
| JP | 11177046 | 2/1999 |
| JP | 11074483 | 3/1999 |
| JP | 11274427 | 8/1999 |
| TW | 529087 B | 4/2003 |
| WO | 0075984 A1 | 12/2000 |

* cited by examiner

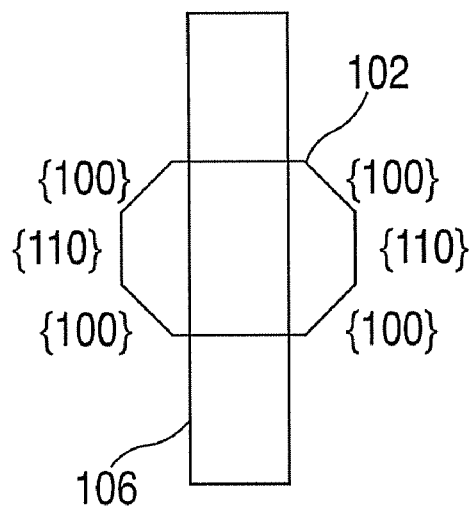
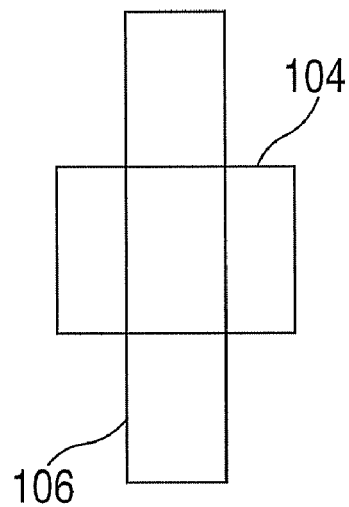
FIG. 1(a)   FIG. 1(b)
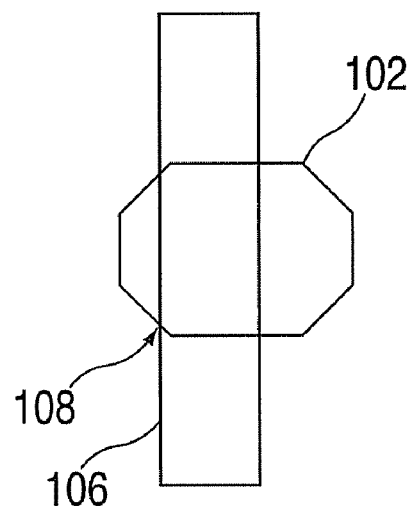
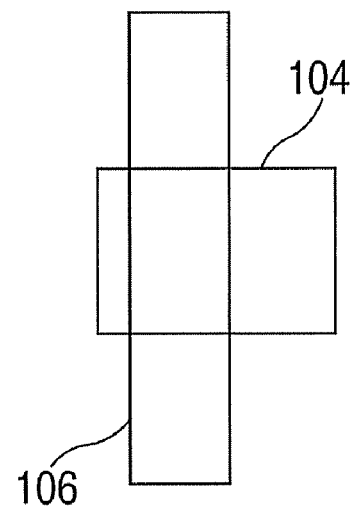
FIG. 2(a)   FIG. 2(b)

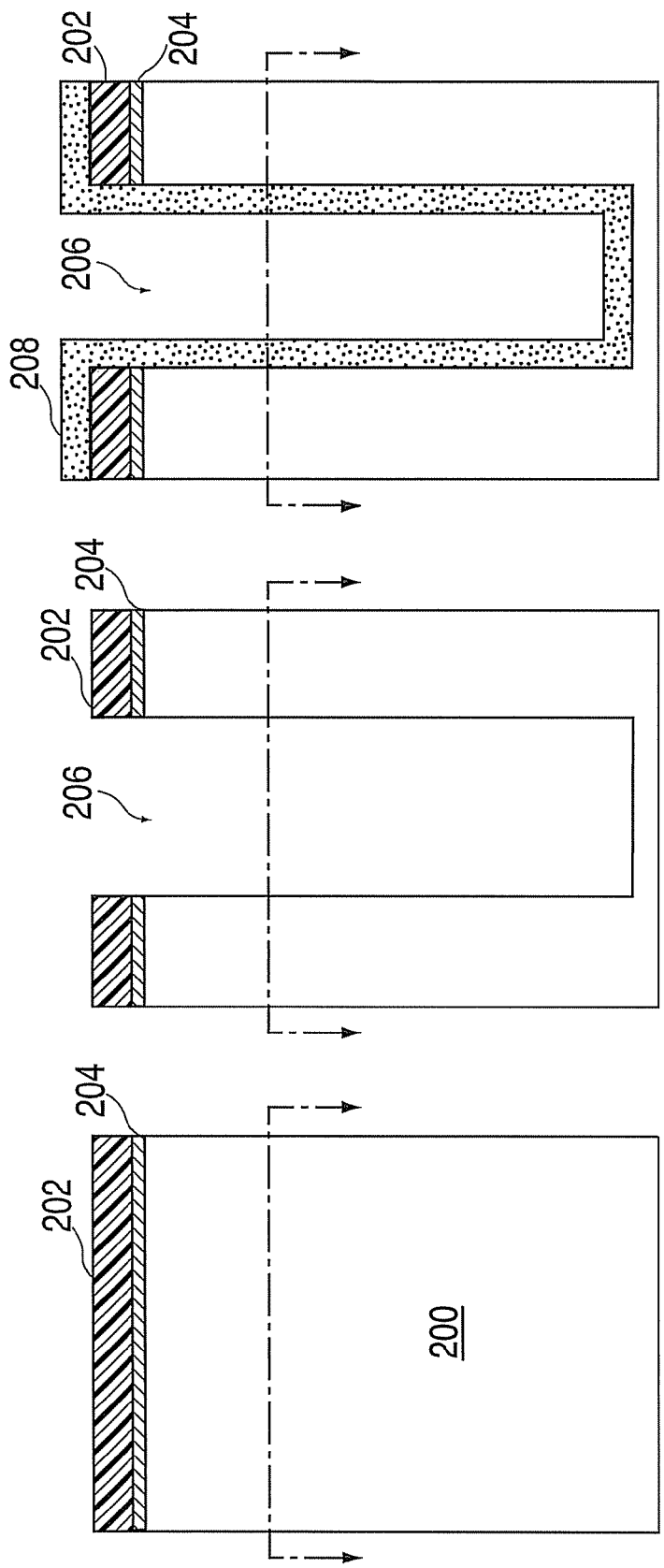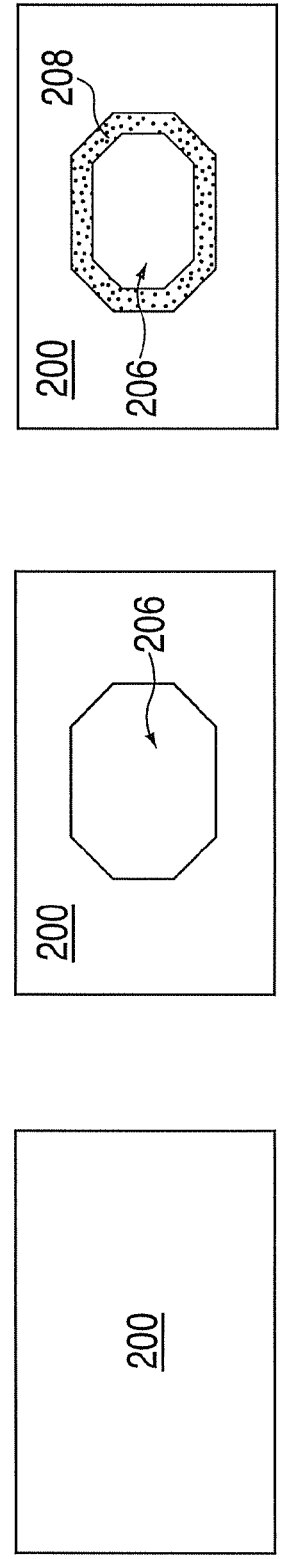
FIG. 8
FIG. 7
FIG. 6

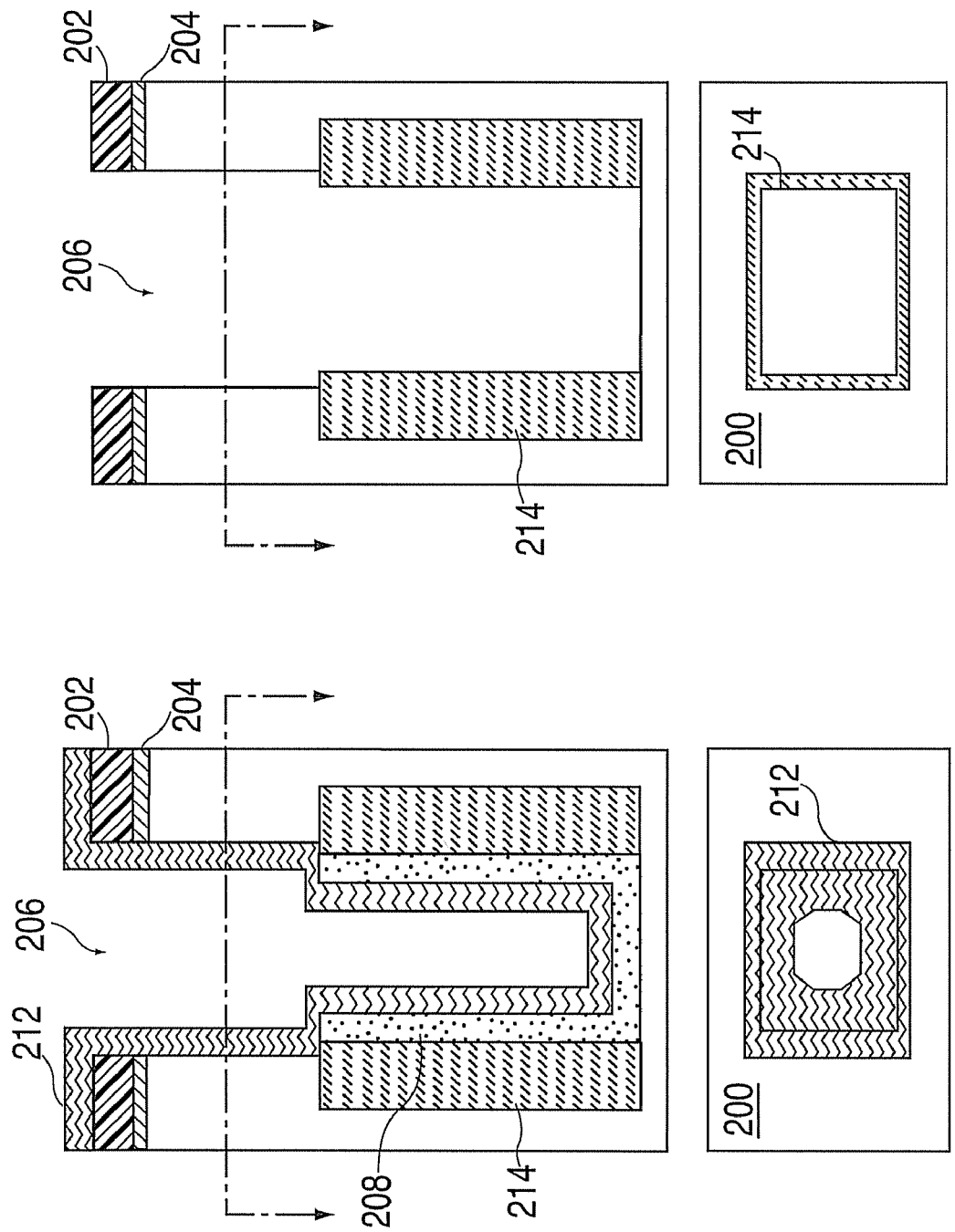

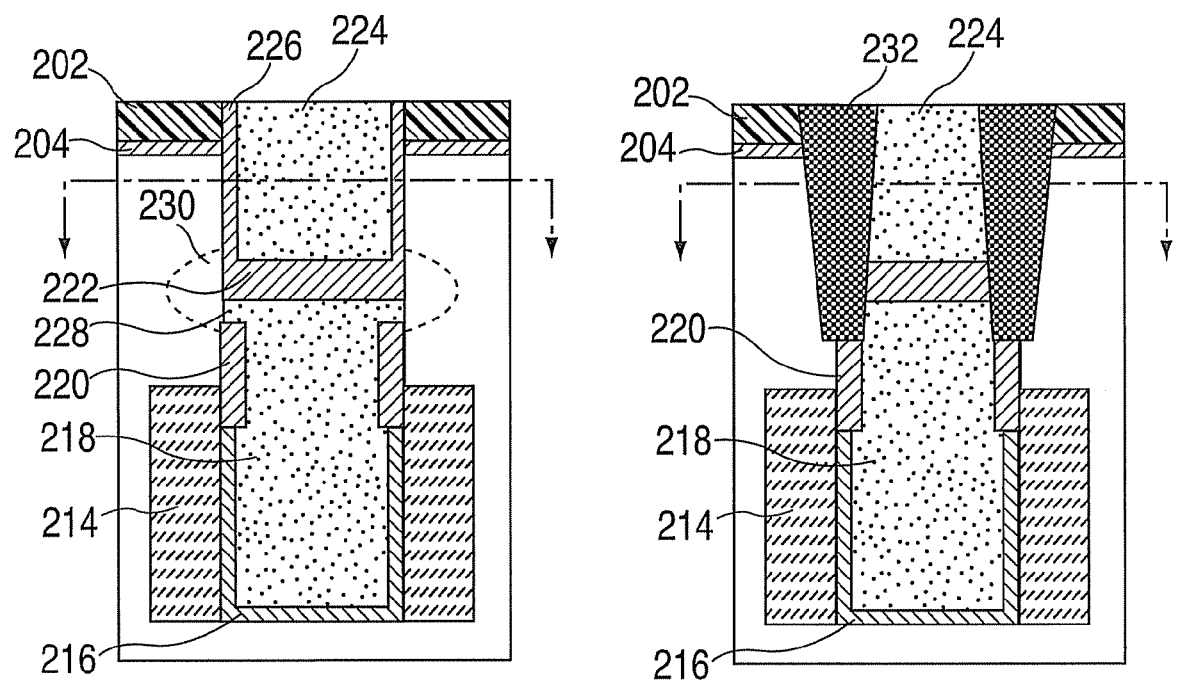
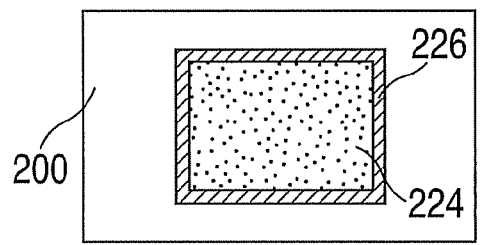
FIG. 15
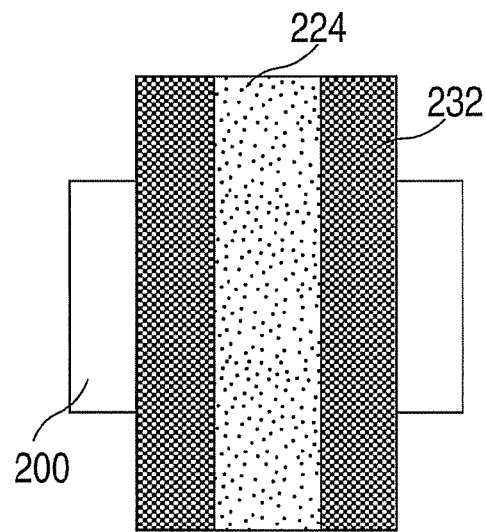
FIG. 16

BURIED PLATE STRUCTURE FOR VERTICAL DRAM DEVICES

CROSS REFERENCE TO RELATED APPLICATIONS

The present application is a divisional application of U.S. patent application, Ser. No. 11/085,663, filed Mar. 21, 2005, now U.S. Pat. No. 7,247,536, which is a divisional application of U.S. patent application, Ser. No. 10/604,565, filed Jul. 30, 2003, now U.S. Pat. No. 6,913,968, the contents of which are incorporated herein by reference in their entirety.

BACKGROUND

The present invention relates generally to semiconductor structures and semiconductor device processing and, more particularly, to a method for implementing self-aligned, deep trench shaping for vertical DRAM devices.

Dynamic random access memory (DRAM) is a type of semiconductor memory in which the information is stored as data bits in capacitors on a semiconductor integrated circuit. Each bit is typically stored as an amount of electrical charge in a storage cell consisting of a capacitor and a transistor. A practical DRAM circuit usually includes an array of memory cells interconnected by rows and columns, which are generally referred to as wordlines and bitlines, respectively. Reading data from or writing data to memory cells is achieved by activating selected wordlines and bitlines. More specifically, a trench DRAM memory cell may include a metal-oxide-semiconductor field-effect transistor (MOSFET) connected to a deep trench (DT) capacitor. The transistor includes gate and diffusion regions that are referred to as either drain or source regions, depending on the operation of the transistor.

Typically, the deep trench capacitor is formed in a silicon substrate using one or more conventional techniques, such as reactive ion etching (RIE), with photoresist or other materials as a mask to cover the areas where trench formation is not desired. The trench is typically filled with a conductor material (most commonly n-type doped polysilicon), which serves as one plate of the capacitor, usually referred to as the "storage node". The second plate of the capacitor is typically formed by outdiffusion of an n-type doped region surrounding the lower portion of the trench, usually referred to as the "buried plate". A node $\in$ layer, which may include, for example, silicon dioxide ($SiO_2$), silicon nitride (SiN), silicon oxynitride (SiON), tantalum oxide ($Ta_2O_5$), aluminum oxide ($Al_2O_3$), or any other $\in$ material, is provided to separate the storage node and buried plate, thereby forming the capacitor. The connection between the transistor and the capacitor is achieved through the formation of what is known in the art as a "buried strap", which is commonly formed by outdiffusion of dopants from the doped polysilicon to the substrate.

Compared to a planar DRAM device, which includes a planar transfer device and a storage node in a trench, a vertical DRAM device exploits a trench to form both the storage node and the transfer device. Such vertical DRAM devices have significant advantages. For example, the memory density is increased because the length of the vertical signal transfer device channel is determined by a recess process, and therefore it is decoupled from the minimum feature size which is limited by the capability of the lithography. The vertical configuration also allows longer channel lengths without a proportional decrease in memory density. Channel length can also be properly scaled relative to gate oxide thickness and relative to junction depth to reduce channel doping, minimize junction leakage, and increase retention times.

In order to prevent carriers from traveling through the substrate between the adjacent devices (e.g., capacitors), device isolation regions are formed between adjacent semiconductor devices. Trench isolation (IT) is generally used in the fabrication of advanced semiconductor devices. A sharply defined trench is formed in the semiconductor substrate, and the trench is thereafter filled with oxide back to the surface of the substrate to provide a device isolation region. The remaining surfaces of the substrate without IT are generally referred to as the active area (AA).

During the formation of the deep trenches, the actual resulting shape of the deep trenches is not geometrically rectangular at the upper trench portion due to the crystalline orientation dependence of the etch rate in a reactive ion etch (RIE) process. Rather, the upper portion of the etched deep trench takes on an octagonal configuration. In addition, because of process variations that occur during device processing, perfect alignment of the active areas (AA) to the deep trenches is not always achieved. As a result, the combination of a non-rectangular shaped deep trench and an AA-DT misalignment can cause a variation of the device threshold voltage ($V_t$) and consequently degrades the DRAM device performance.

SUMMARY

The foregoing discussed drawbacks and deficiencies of the prior art are overcome or alleviated by a buried plate region for a semiconductor memory storage capacitor, wherein the buried plate region is self aligned with respect to an upper portion of a deep trench containing the memory storage capacitor.

BRIEF DESCRIPTION OF THE DRAWINGS

Referring to the exemplary drawings wherein like elements are numbered alike in the several Figures:

FIGS. 1(a) and 1(b) are schematic diagrams depicting a comparison between an unshaped deep trench and a rectangular shaped deep trench, respectively, with no misalignment between the deep trench and active area of a DRAM device;

FIGS. 2(a) and 2(b) are schematic diagrams depicting a comparison between an unshaped deep trench and a rectangular shaped deep trench, respectively, with a misalignment between the deep trench and active area of a DRAM device;

FIGS. 6 through 16 are cross-sectional and top views of a self-aligned, deep trench shaping process for the upper portion of the trench, in accordance with an embodiment of the invention.

DETAILED DESCRIPTION

Disclosed herein is a shaped, upper trench structure and method for a DRAM cell that has a buried plate self-aligned to the shaped upper trench. Briefly stated, an integration scheme incorporates a process to shape the upper portion of the deep trenches to a generally rectangular shape, thereby improving the overlay of active area (AA) to deep trench (DT) in vertical gate devices.

Referring initially to FIGS. 1(a) and 1(b), there is shown a schematic top view illustrating comparison between an unshaped deep trench 102 and a rectangular shaped deep trench 104, respectively, with no misalignment between the deep trench and active area 106 of a DRAM device. As can be seen, the top of the unshaped trench 102 takes on an octagonal shaped resulting from the crystalline orientation dependent etch process described above. So long as there is satisfactory alignment of the active area to the deep trench, the unshaped trench 102 generally does not present a problem in terms of threshold voltage shift of the vertical DRAM device.

However, in the event of a misalignment, such as shown in FIG. 2(a) for example, the active area 106 crosses the corner of two neighboring crystal planes, as indicated by the arrow 108. This results in a disturbance in device threshold voltage and hence a degradation in device performance. On the other hand, as shown in FIG. 2(b), the same alignment shift does not result in the crossing of the active area 106 over the deep trench corner if the upper portion of the deep trench is shaped in a generally rectangular fashion.

Figure 5:
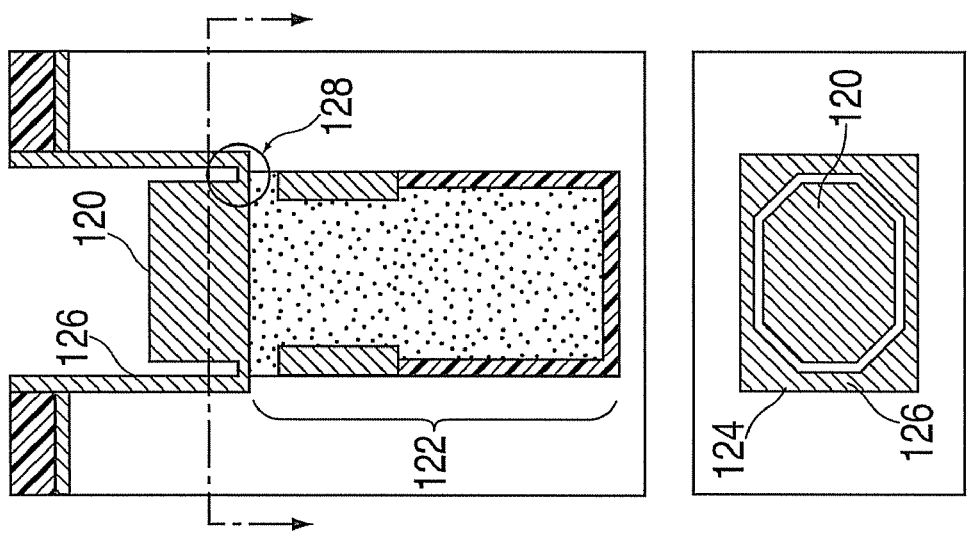
FIGS. 3 through 5 illustrate one possible trench shaping process utilized in the formation of a vertical DRAM cell.
Figure 4:
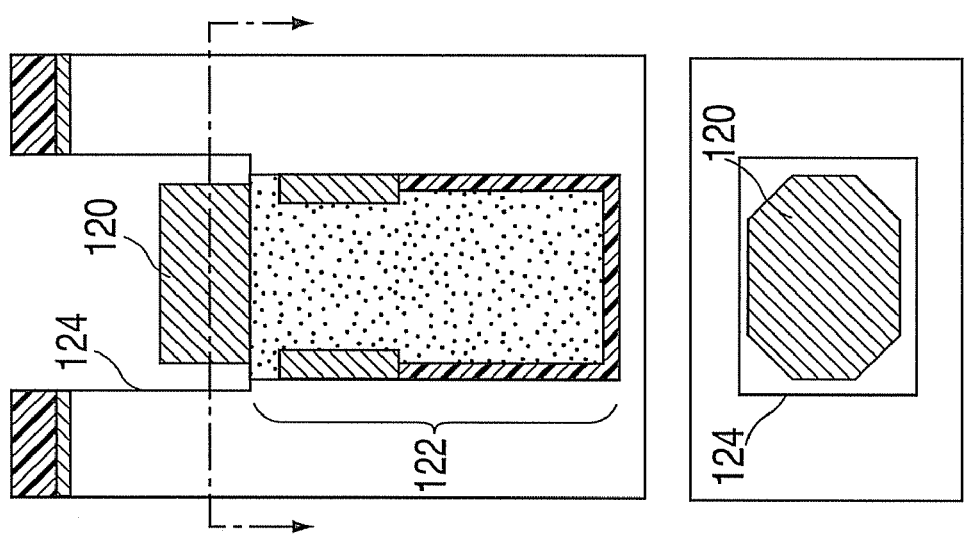
Figure 3:
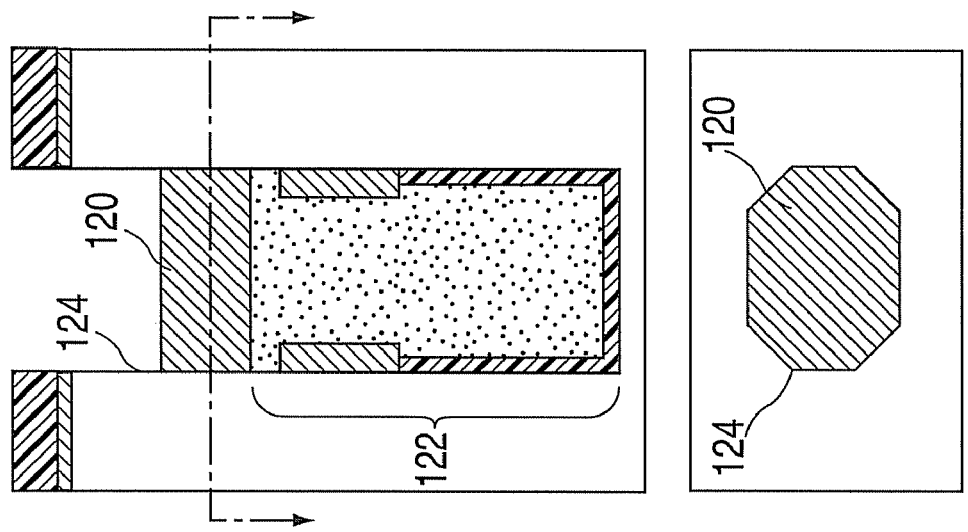

Accordingly, deep trench shaping (i.e., a process to shape the octagonal upper portion of trenches so as to make them rectangular) has been developed to address this problem. Initially, this shaping was tested at the final stages of the deep trench/DRAM cell formation process, as shown in FIGS. 3 through 5. In particular, FIG. 3 illustrates the formation of a trench top oxide material 120 atop a completed trench capacitor, designated generally at 122. (It will be noted that the buried plate portion of the capacitor is not illustrated in FIGS. 3-5.) As shown in the top-down, cross-sectional slice in the lower portion of FIG. 3, the trench top oxide 120 is formed prior to any shaping of the octagonal upper portion of the trench 124. FIG. 4 illustrates the widening of the upper part of the trench 124 to a generally rectangular shape with an ammonia wet etch, followed by the formation of the gate ∈ 126 (such as an oxide) as shown in FIG. 5.

Unfortunately, one problem discovered with this DT upper shaping approach is that the neighboring trenches could merge together as trenches have become more significantly widened during prior processing steps. These merging trenches can then cause film peeling on the wafers, which in turn results in severe contamination issues. In addition, the shaping of the upper trench after formation of the trench top material 120 degrades the reliability of the vertical gate ∈ 126 due to the irregularity of the corner between the trench top material 120 and the gate ∈ 126, as indicated by the arrow 128. Thus, it would be desirable to be able to implement a trench shaping process that improves the AA-DT overlay tolerance for vertical array devices without causing trench merging and/or gate ∈ reliability degradation.

Therefore, in accordance with an embodiment of the invention, FIGS. 6-16 illustrate an exemplary process sequence that may be used to create a vertical DRAM cell wherein the upper portion of the deep trench thereof is shaped in a manner such that the upper portion of the trench is aligned with the buried plate formed by outdiffusion at the lower portion of the trench. The trench shaping is performed before the formation of the trench top material.

As shown in FIG. 6, the starting material is a semiconductor substrate 200 having a pad layer 202 (e.g., nitride) formed atop an optional oxide layer 204. The substrate 200 may be any suitable semiconductor material, such as silicon (Si), germanium (Ge), SiGe, silicon-on-insulator (SOI), gallium arsenide (GaAs), gallium phosphide (GaP), etc. The thickness of the pad oxide layer 204 may be from about 1 nanometer (nm) to about 20 nm, while the thickness of the pad nitride layer 202 may be from about 20 nm to about 500 nm.

FIG. 7 illustrates the formation of a deep trench 206 through the pad layers 202, 204 and into the substrate 200 in accordance with conventional trench formation techniques known. The depth of the trench 206 may be from about 1 micron (μm) to about 15 μm, for example. It will be noted from the top view portion of FIG. 7 that the shape of the upper part of the trench 206 is octagonal. In addition, for purposes of clarity, the top down view portions of the Figures illustrate the view in cross section, and therefore do not illustrate any material present at the very bottom of the trench 206.

Then, as shown in FIG. 8, a dopant source material 208 is deposited on the trench sidewalls, and is used to provide the dopant material for diffusion into the substrate during the buried plate formation of the trench capacitor. The dopant source material may be any suitable material containing dopants such as arsenic (As), phosphorous (P), antimony (Sb) for n-type buried plate, or, in the event a p-type buried plate is desired, boron (B). However, a preferred dopant material is arsenic-doped silicate glass (ASG). The dopant source material may be deposited by a chemical vapor deposition (CVD) process, such as low pressure chemical vapor deposition (LPCVD), and plasma enhanced chemical vapor deposition (PECVD), etc. In the exemplary embodiment described hereinafter, ASG is used as the dopant source material. The thickness of ASG layer 208 may be, for example, about 5 nm to about 100 nm, depending on the trench size.

Figure 10:
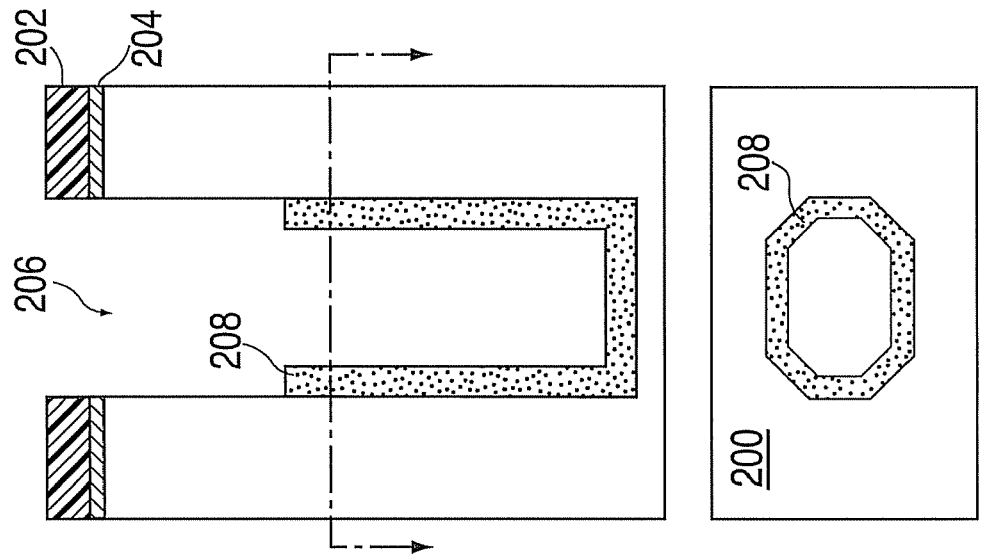
Figure 9:
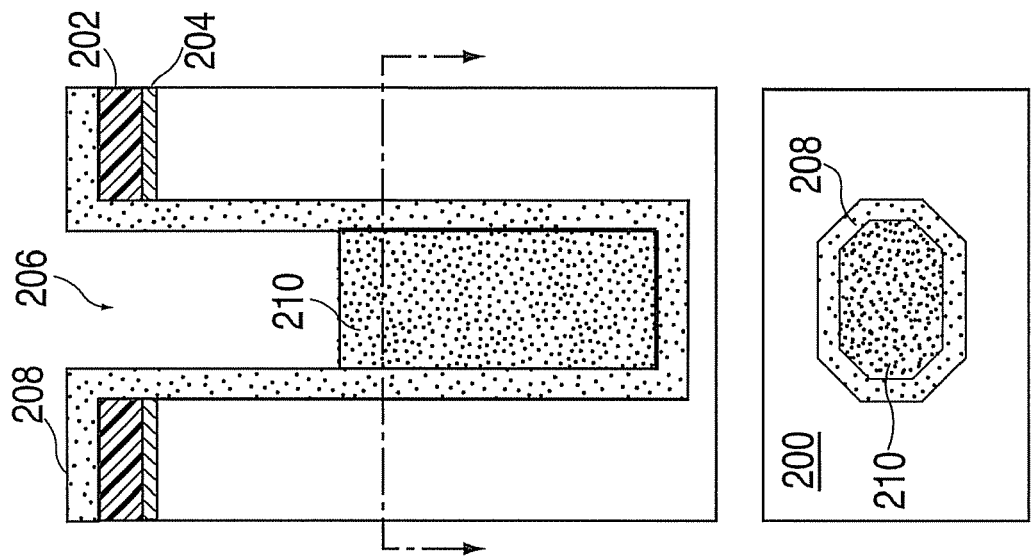

Once the ASG layer 208 is formed on the trench sidewalls, the trench 206 is filled with photoresist 210, which is thereafter recessed to a predetermined depth as shown in FIG. 9. The recessed photoresist 210 serves as an etch stop layer during the next process step such that the ASG layer 208 is removed from the upper portion of the deep trench 206 while remaining in the lower portion of the trench 206 for the buried plate formation. The photoresist recess step may be accomplished by a chemical dry etching (CDE) process, for example. As shown in FIG. 10, the ASG layer 208 in the upper portion of the trench 206 is stripped while ASG in the lower portion of the trench 206 is protected by the photoresist 210. The removal of the ASG material may be achieved by buffered hydrofluoric (BHF) etch, or a diluted hydrofluoric (DHF) etch. Thereafter, the remaining photoresist in the lower trench is then stripped by a wet process, such as sulfuric acid/hydrogen peroxide ($H_2SO_4/H_2O_2$), or by dry process such as CDE or ashing. As a result, only the lower portion of the trench 206 is covered by the ASG layer 208.

Figure 12:
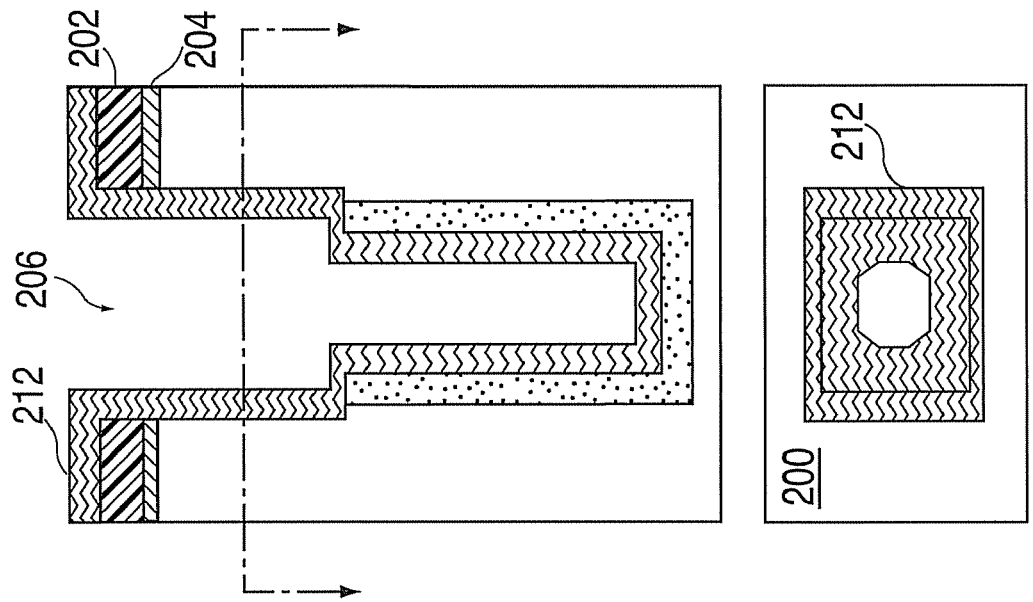
Figure 11:
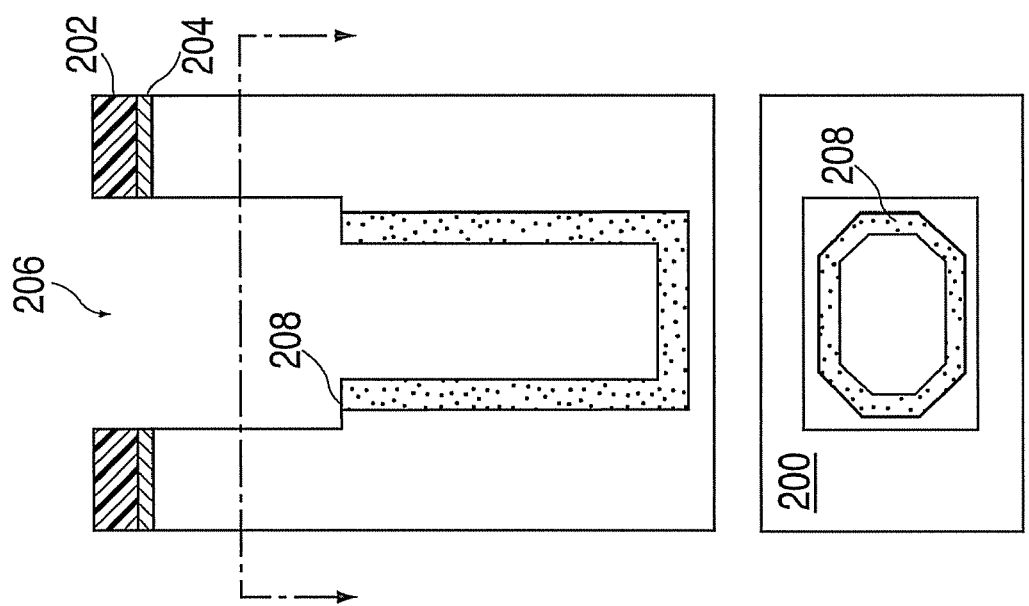

Referring now to FIG. 11, the shaping of the upper portion of the trench 206 is illustrated. Through the use of an ammonia wet etch, the octagonal trench surfaces are shaped to a generally rectangular configuration due to the fact that ammonia etches silicon at different rates on different crystalline planes. Moreover, because the lower trench surfaces are protected by the ASG layer 208, there is no shaping therein. Because the upper trench surfaces are shaped at this particular point in the process, they will be self-aligned to the buried plate. Other etch processes that have different etch rate at different crystalline orientations may be used for trench shaping, such as a KOH etch or plasma etch, for example. Then, as shown in FIG. 12, a cap layer 212 is optionally formed over the entire trench sidewall to seal the ASG layer 208. The cap layer 212 may include undoped oxide, polysilicon, nitride material, for example. The cap layer may be formed by known CVD process.

A thermal anneal to drive the dopant into the substrate so as to form the buried plate 214 that is self-aligned to the shaped upper trench is shown in FIG. 13. Preferably, the wafer is thermally annealed at a temperature of about 800° C. to about 1200° C. for about 1 to about 60 minutes, more preferably at about 1050° C., for about 3 minutes. The annealing environment may contain oxygen, nitrogen, hydrogen, argon, or any combination thereof. If oxygen is present, the sidewall of the lower trench covered by ASG will be oxidized to form an oxide layer (not shown). Then, both the cap layer 212 and the ASG layer 208 are stripped by BHF or DHF as shown in FIG.

14. If the annealing is performed in the environment containing oxygen, the formed oxide layer described above is stripped along with ASG and cap layers to form a bottle-shape (not shown) in the lower portion of trench (bottle is not shown). The formed bottle-shape is also aligned to the shaped upper portion of the trench.

At this point, the cell is prepared for the remaining steps in the formation of a vertical DRAM device, shown in FIG. 15, including the deposition of a node ∈ material 216 (e.g., $Si_3N_4$, SiON, $SiO_2$, or other high ∈ constant materials), and a node conductor material 218 (e.g., doped polysilicon) to complete the formation of the trench capacitor. The vertical device also includes a collar 220 (e.g., an oxide) to isolate the access transistor in the upper trench from the trench capacitor in the lower trench. A trench top insulating material 222 (e.g., an oxide) isolates the gate conductor 224 from the node conductor 218. A gate ∈ 226 (e.g., an oxide) is formed on the upper trench sidewalls for the vertical transistor. In addition, a buried strap 228 electrically bridges the node conductor to out-diffusion 230 of the access transistor. Further information regarding the formation of vertical transistors may be found in U.S. Pat. Nos. 6,414,347 and 6,440,793, assigned to the assignee of the present application, the contents of which are incorporated herein by reference.

Finally, FIG. 16 illustrates the formation of isolation trenches 232 for electrical isolation of the neighboring cells/devices, wherein the trenches are etched and then filled with an insulating material such as an oxide.

It will thus be appreciated that even when a misalignment of the device active area to the deep trench, the active area will still only cross one orientation of the substrate crystalline planes as a result of the shaped, square upper portion of the trench. In addition, it is also contemplated that the above described disclosure contemplates any scheme that shapes the upper trench without shaping the lower trench. For example, the ASG may be replaced by any other materials such as nitride, SiC, SiGe, or undoped oxide to cover the lower trench by resist recess. In other words, the material used to shield the lower portion of the trench from shaping is not necessarily also to be the dopant source material used to form the buried plate.

As compared with the post trench top oxide shaping approach shown in FIGS. 3-5, the present scheme has several advantages. First, the shaping of the upper portion of the deep trenches is performed at the early stage of device fabrication, so trenches are less susceptible to the problem of merging. Second, because the lower portions of the trench are covered by ASG, only the upper portion gets shaped during the wet etch. Thus, if there are any defects in the lower portion of the trench, such as side pockets for example, they will not be aggravated by the above process. Finally, any ASG residue on the sidewall of the upper trench will be lifted off during shaping, thereby suppressing any undesired arsenic doping in the upper trench.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A buried plate region for a semiconductor memory storage capacitor, wherein the buried plate region is formed in a lower portion of the deep trench and is self aligned with respect to an upper portion of a deep trench containing said memory storage capacitor, such that a distance between opposing faces of the buried plate region is smaller than that of a distance between corresponding opposing faces of the upper portion of the deep trench, and wherein the lower portion of the deep trench has a dopant type having an opposite polarity with respect to a dopant type of said upper portion.

2. The buried plate region of claim 1, wherein the lower portion of the deep trench is doped with an n-type dopant.

3. The buried plate region of claim 2, wherein the lower portion of the deep trench is doped by one or more dopants selected from the group of: phosphorus, arsenic, and antimony.

* * * * *